(12) United States Patent
Savelainen

(10) Patent No.: US 6,288,624 B1
(45) Date of Patent: Sep. 11, 2001

(54) ENLONGATED FIELD OF VIEW OPEN MAGNETIC RESONANCE IMAGING SYSTEM WITH DIPOLE MAGNET

(75) Inventor: Matti K. Savelainen, Espoo (FI)

(73) Assignee: Picker Nordstar Corporation, Helsinki (FI)

(*) Notice: Subject to any disclaimer, the term of this patent is extended or adjusted under 35 U.S.C. 154(b) by 0 days.

(21) Appl. No.: 09/447,923

(22) Filed: Nov. 23, 1999

(51) Int. Cl.⁷ .................................................. H01F 5/00

(52) U.S. Cl. ........................................... 335/299; 335/216

(58) Field of Search ............................ 335/216, 299–301; 324/318–320

(56) References Cited

U.S. PATENT DOCUMENTS

| | | | |
|---|---|---|---|
| 5,568,109 | * 10/1996 | Takayama | 335/213 |
| 5,680,086 | * 10/1997 | Allis et al. | 335/296 |
| 5,799,653 | 9/1998 | Carlson | 324/318 |
| 5,883,558 | 3/1999 | Laskaris et al. | |
| 5,936,404 | * 8/1999 | Ladebeck et al. | 324/300 |
| 6,011,456 | * 1/2000 | Eckels et al. | 335/300 |

OTHER PUBLICATIONS

"The LHC Conceptual Design Report—The Yellow Book", CERN/AC/95–05 (LHC), (no date).

European Organization for Nuclear Research Oct. 20, 1995 (latest edition available at: http://www.cern.ch/CERN/LHC/YellowBook95/LHC95/ ).

* cited by examiner

Primary Examiner—Lincoln Donovan
(74) Attorney, Agent, or Firm—Fay, Sharpe, Fagan, Minnich & McKee, LLP

(57) ABSTRACT

A first dipole magnet (10) and a second dipole magnet (12) extend annularly through ceiling and floor regions of a magnetic resonance examination room. Ferromagnetic field concentrating elements (16, 18) have a peripheral dimension that increases with radius and a vertical cross-section that decreases with radius for focusing and concentrating a magnetic field through an examination region (14). The ferromagnetic elements have outward flared edges (20, 22) extending outward and toward each other to improve the homogeneity of the magnetic field in the examination region. The dipole magnets include an annular ferrous member (60) with a first superconducting winding (62) of a first polarity disposed on one surface and a second superconducting winding (64) of opposite polarity disposed on the opposite surface. The superconducting windings are held in place by arched elements (66, 68) and potting elements (70, 72). Grooves in side elements (102, 104) of a helium can (100) clamp the edges of the arched elements to the annular ferrous member. The ferrous member (60) has alternating peripheral projections (80) and recesses (82) which correspond to alternating peripheral projections (84) and recesses (86) on the peripheral edges of the magnetic elements (16, 18) and alternating projections (88) and recesses (90) on peripheral edges of a ferrous return path (24).

21 Claims, 4 Drawing Sheets

ENLONGATED FIELD OF VIEW OPEN MAGNETIC RESONANCE IMAGING SYSTEM WITH DIPOLE MAGNET

BACKGROUND OF THE INVENTION

The present invention relates to the magnet arts. It finds particular application in conjunction with magnetic resonance imaging and will be described with particular reference thereto. However, it is to be appreciated, that the invention will also find application in conjunction with magnetic resonance spectroscopy and other applications which use strong, controlled magnetic fields.

Heretofore, open or vertical field magnetic resonance imaging systems have typically included a pair of circular pole pieces disposed parallel to each other on opposite sides of an examination region. The pole pieces included various ferrous, magnetic, and other structures for shaping the magnetic field in the examination region. The pole pieces also supported radio field and gradient magnetic field coils.

Typically, cylindrical ferrous elements extended from the back sides of the pole face away from the examination region. The cylindrical ferrous elements commonly connected with ferrous flux return paths reduce fringe fields and electromagnetic drive coil requirements. Of course, magnetic fields will return through the air and non-ferrous structures, with a greater expenditure of energy.

Magnetic coils were commonly placed around the cylindrical ferrous members and adjacent the pole pieces to generate a magnetic field that flows between the pole pieces through the examination region and back around through a ferrous or non-ferrous return path. Resistive and superconducting magnets have been utilized. Electromagnetic coils have also been placed along the return path, primarily when the magnets have concentrated return paths as are found in C-magnets or H-magnets.

Magnetic field uniformity in the region of interest is a significant concern in magnetic resonance imaging applications. Circular symmetry of the pole pieces and adjacent rose ring ferrous structure has been used extensively as a tool for achieving and promoting this uniformity.

The prior open magnetic resonance imaging systems have tended to have relatively small imaging regions. Placement of the electromagnetic coils for generating the magnetic field was usually close to the poles. This symmetrical circular arrangement supported a uniform and symmetrical magnetic field distribution in the imaging region. Power dissipation in resistive coils and saturation properties of the ferrous core were additional engineering considerations. Unfortunately, the electromagnetic coils often occupy valuable space close to the imaging region and introduce thermal management problems near the poles.

The present invention overcomes the above-referenced problems and others.

SUMMARY OF THE INVENTION

In accordance with one aspect of the present invention, a magnet assembly is provided. A magnet coil surrounds a first cross-sectional area. A ferrous element of a second, cross-sectional area smaller than the first cross-sectional area is disposed adjacent an examination region. The ferrous element concentrates a magnetic field generated by the magnet coil through the examination region. A ferromagnetic path, preferably integral with the first ferrous element, extends between the ferrous element and an inner surface of the magnet coil. The ferromagnetic path spreads in one dimension and thins in another to steer and concentrate the magnetic field through the ferrous element. Preferably, the spreading and thinning are coordinated to maintain a substantially constant cross-section.

In accordance with a more limited aspect of the present invention, the magnet coil is a dipole magnet. The dipole magnet includes a ferrous member having a first winding of a first polarity on one side and a second winding of a second polarity on an opposite side. Arched elements extend from the ferrous member over each of the windings. Potting structures extend between the arched elements, the ferrous yoke, and the windings to hold the windings securely in place.

In accordance with another aspect of the present invention, a magnetic resonance imaging apparatus is provided including a magnet assembly as described above.

In accordance with another aspect of the present invention, a magnetic field is generated peripherally in a generally radial direction. The magnetic field is channeled, turned, and converged. The converged magnetic field is passed through an examination region.

In accordance with another aspect of the present invention, a magnet construction is provided. First and second ferrous elements are disposed on opposite sides of a gap for focusing magnetic field across the gap. At least one of the ferrous elements has a maximum axial extent such that as it expands outward to larger peripheral dimensions, it also tapers toward a peripheral edge. First and second coil windings extend peripherally adjacent the peripheral edge and carry current of opposite polarity. In this manner, the first and second windings both generate magnetic fields in a common peripheral direction.

One advantage of the present invention is that it enables the examination region to be enlarged.

Another advantage of the present invention is that it opens the area around the examination region and improves patient access.

Another advantage of the present invention is that it permits higher magnet currents without saturating ferrous magnet structures.

Yet another advantage of the present invention is that it facilitates examination regions with elongated cross-sections.

Still further advantages and benefits of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not be construed as limiting the invention.

DETAILED DESCRIPTION OF THE PREFERRED EMBODIMENTS

Figure 1:
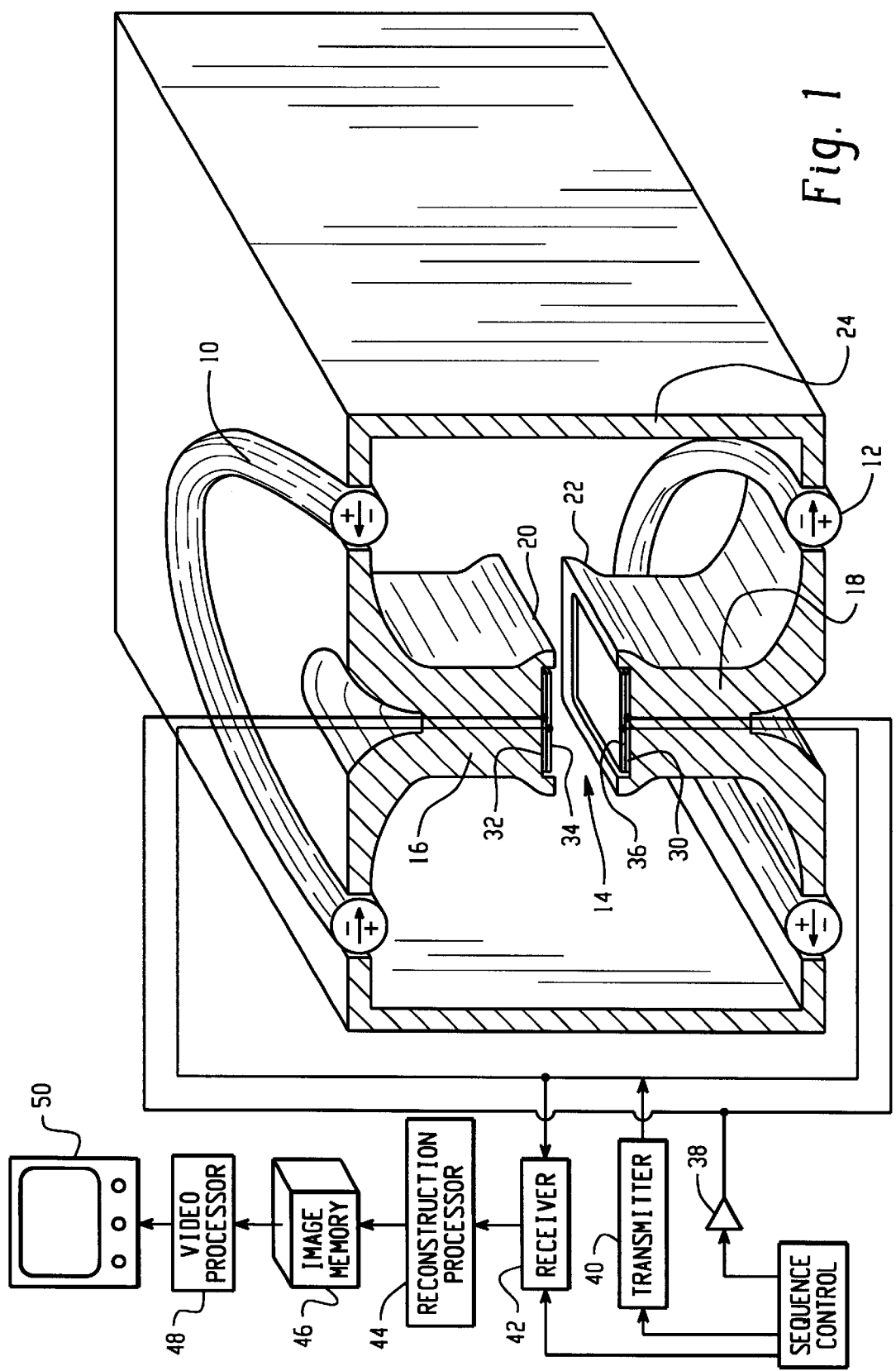
FIG. 1 is a perspective view in partial section of an exemplary magnetic resonance imaging system in accordance with the present invention.

With reference to FIG. 1, first and second dipole magnet coil pairs 10, 12 are disposed above and below an examination region 14. The coil pairs can be circular, elongated, generally rectangular, or other shapes. One of the dipole magnet coil pairs is configured to generate a magnetic field radially outward and the other is arranged to generate a magnetic field radially inward. Of course, the use of a single dipole magnet, non-dipole magnets, either above or below the examination region, or combinations of dipole and non-dipole magnets are also contemplated. The dipole magnet coil pairs are significantly larger in horizontal cross-section than the examination region 14.

A first ferrous magnetic field concentrating or focusing element 16 is disposed above the examination region and extends upward and flares peripherally outward with a peripheral dimension increasing with radial distance. As the peripheral dimension expands, the vertical dimension thins or tapers toward the upper dipole magnet. The peripheral and vertical dimensions are coordinated, preferably to have a substantially constant magnetic field carrying capacity, e.g., a constant cross-section. The first ferrous element 16 defines a peripheral edge adjacent the upper dipole magnet 10. A second or lower magnetic field concentrating or focusing member 18 extends from below the examination region, expanding and tapering peripherally outward to a peripheral edge adjacent the lower magnet coil pair 12.

The field concentrating elements terminate in flared ends 20, 22, respectively, which extend outward and toward each other to reduce fringe fields and urge the magnetic field in the examination region 14 into more nearly parallel paths. The cross-sectional area of the ferrous field concentrating elements is selected in accordance with the dimension of the examination region and the strength of the magnetic field. The ferrous field concentrating elements are selected to have cross-sectional dimensions which are sufficient to carry the concentrated magnetic field without saturating. The field concentrating elements can have circular cross-sections, or elongated cross sections, such as the illustrated, generally rectangular cross-section to enlarge the useful size of the imaging region 14.

It is to be appreciated that although elements are described as upper and lower, vertical and horizontal, the present invention applies equally to a magnet system that is rotated 90°, 45°, or other angles from the illustrated orientation.

As the ferrous field concentrating elements 16, 18 approach the larger in dimension dipole magnets, they spread apart in the horizontal plane. This enables the thickness in the vertical direction of the members to become thinner, without reducing the field carrying capacity of the path. Preferably, a ferrous field return path, such as ferrous walls 24 of comparable thickness, extends outward from the magnets and run vertically through walls of a surrounding room. Optionally, additional dipole magnets may be mounted in the walls extending peripherally around the examination region. Alternately, the return field can be concentrated in the thicker segments, e.g., ferrous pillars at the corners of the room.

For magnetic resonance imaging, gradient magnetic field coils 30, 32 and radio-frequency coils 34, 36 are mounted on the pole pieces. The gradient magnetic field coils are connected with gradient amplifiers 38 for producing current pulses to the gradient field coils to cause corresponding gradient magnetic field pulses as are commonly found in magnetic resonance imaging sequences. A radio frequency transmitter 40 is connected with the radio frequency coils for inducing and manipulating magnetic resonance in the imaging region. A receiver 42 is connected with the radio frequency coils or other localized or surface coils (not shown) for receiving and demodulating the induced magnetic resonance signals. The magnetic resonance signals are conveyed to a reconstruction processor 44 which reconstructs the magnetic resonance signals into an image representation, preferably a volume image representation, that is stored in a volume image memory 46. A video processor 48 under operator control addresses the image memory and retrieves appropriate slices, renderings, projections, and the like and converts them into appropriate format for display on a video monitor or other human-readable display 50.

Figure 2:
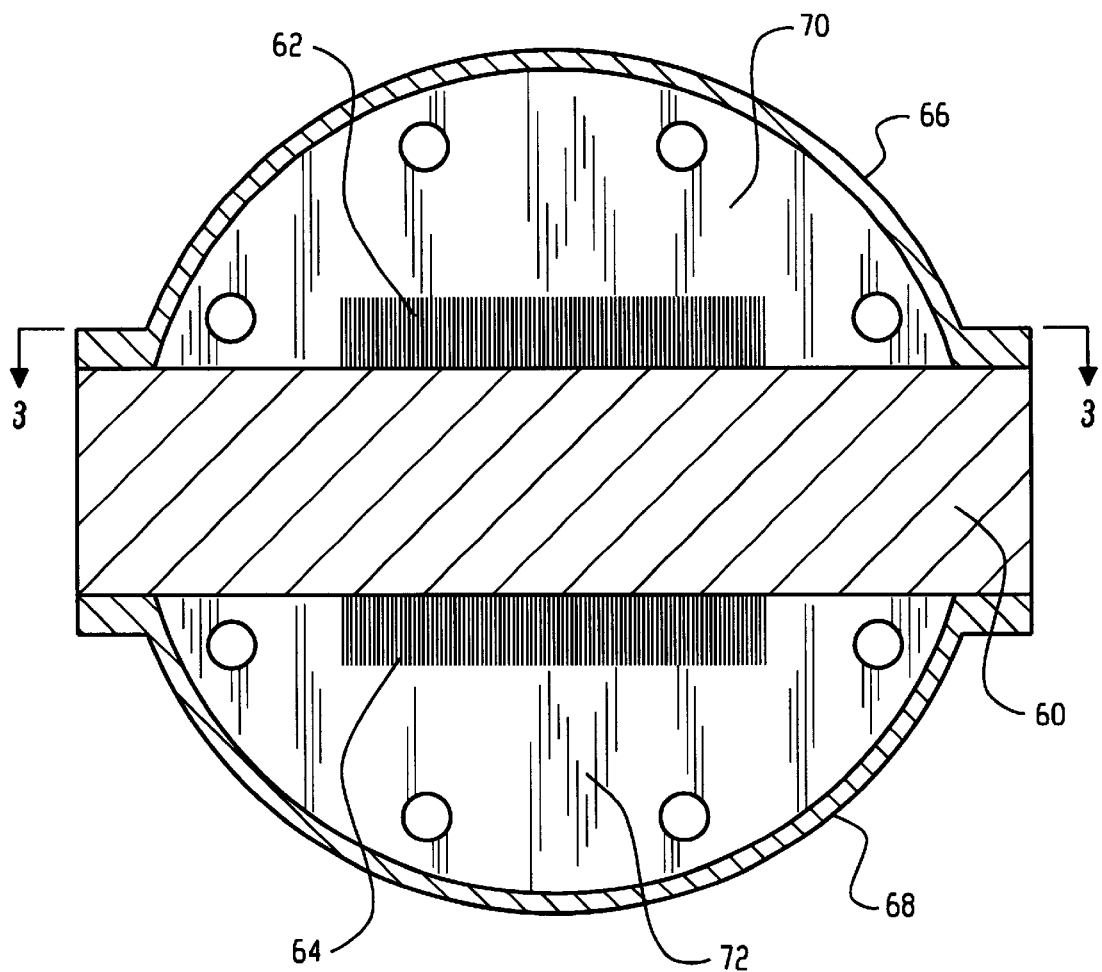
FIG. 2 is a detailed cross-sectional view through one of the dipole magnets of FIG. 1.
Figure 5:
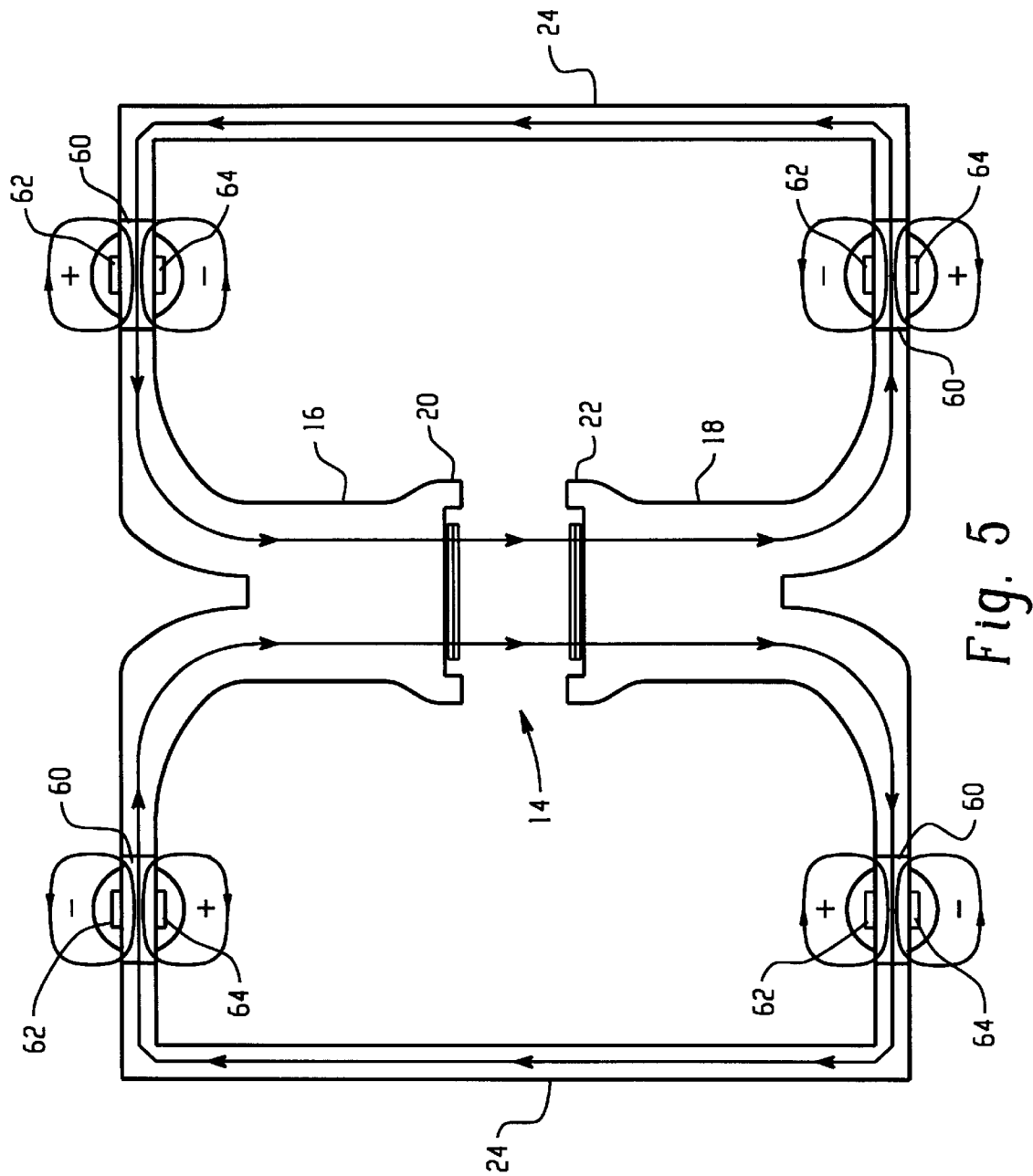
FIG. 5 is a cross-sectional view including selected theoretical field lines.

With reference to FIG. 2, the preferred dipole magnets include a central ferrous member or ring 60 of appropriate thickness to carry the generated magnetic flux. Typically, the thickness is commensurate with the thickness of the adjoining portion of the magnetic field concentrating element 16, 18, but may be thicker or thinner. A first superconducting coil 62 is mounted in one orientation to one surface of the ferrous member 60 with a clockwise current flow in the illustrated embodiment, and a second superconducting magnet 64 of opposite polarity is mounted to the opposite side with a counter clockwise current flow. This opposite polarity pairing causes magnetic fields in the same direction through the annular ferrous member 60 as illustrated in FIG. 5

The illustrated opposite polarity coils 62 and 64 each produce horizontal fields in all of the ferrous members 60. In the illustrated embodiment, the upper opposite polarity coils 62 and 64 both generate magnetic fields horizontally and radially inward through the upper disc-shaped member 60. Analogously, the lower opposite polarity coils 62 and 64 both generate magnetic fields horizontally and radially outward through the lower disc-shaped member 60.

In a preferred embodiment, the superconducting magnets are in principle like the Main Bending Dipole Magnets in the LHC (Large Hardron Collider) project at CERN, which have superconductive strands that are locked in an appropriate position (into and out of the plane of FIG. 2) by a collaring device. In this invention, the dipole magnet opposite to the LHC can also have a ferrous yoke. More specifically, aluminum, stainless steel, or other non-ferromagnetic housing portions 66, 68 are welded or otherwise firmly connected to the ferrous member or yoke 60. A series of baffles or other potting structures 70, 72 have peripheral edges that engage the housing 66, 68 and a notch at the base whose surfaces engages and constrains the superconducting elements, and a base surface that engages the annular ferrous member to lock the superconducting elements in place. Passages are preferably provided through or between the baffles to permit the circulation of liquid helium or other coolant to maintain the coils at their superconducting temperatures.

Figure 3:
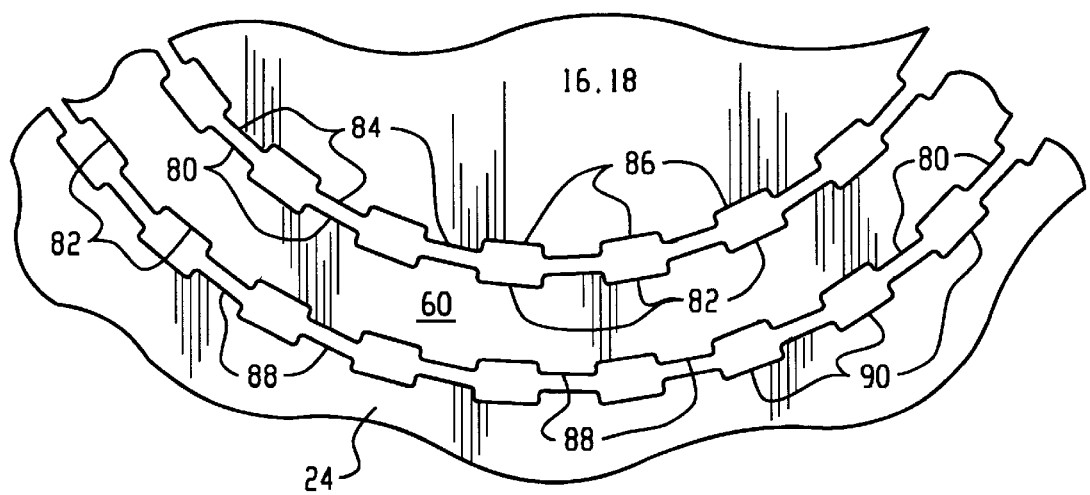
FIG. 3 is a sectional view through section 3—3 of FIGS. 2 and 4.

With reference to FIG. 3, the annular ferrous member 60 includes a series of alternating projections 80 and gaps 82 on its inner and outer peripheral surfaces. Adjacent an inner edge of the annular ferrous member, the ferrous field concentrating elements 16, 18 includes an analogous series of projections 84 and gaps 86 at their peripheral edges. The projections of the adjacent structures are aligned. In this manner, the matched castellated structures cause regions of high and low magnetic field density. If a movement should occur between the yoke and the field concentrating member, the areas of high field density would apply a counteracting force pulling the projections back toward their maximum magnetic field transfer position. The ferrous flux return paths 24 include an analogous series of projections 88 and recesses 90 which mate with the projections and recesses on the opposite side of the annular ferrous member 60. The air gap between the annular ferrous member and the surrounding ferrous structures is selected to minimize the magnetic energy potential. The magnetic forces can also be utilized to help levitate the upper field concentrating element 16 and to minimize boil-off of the cooling fluid.

Figure 4:
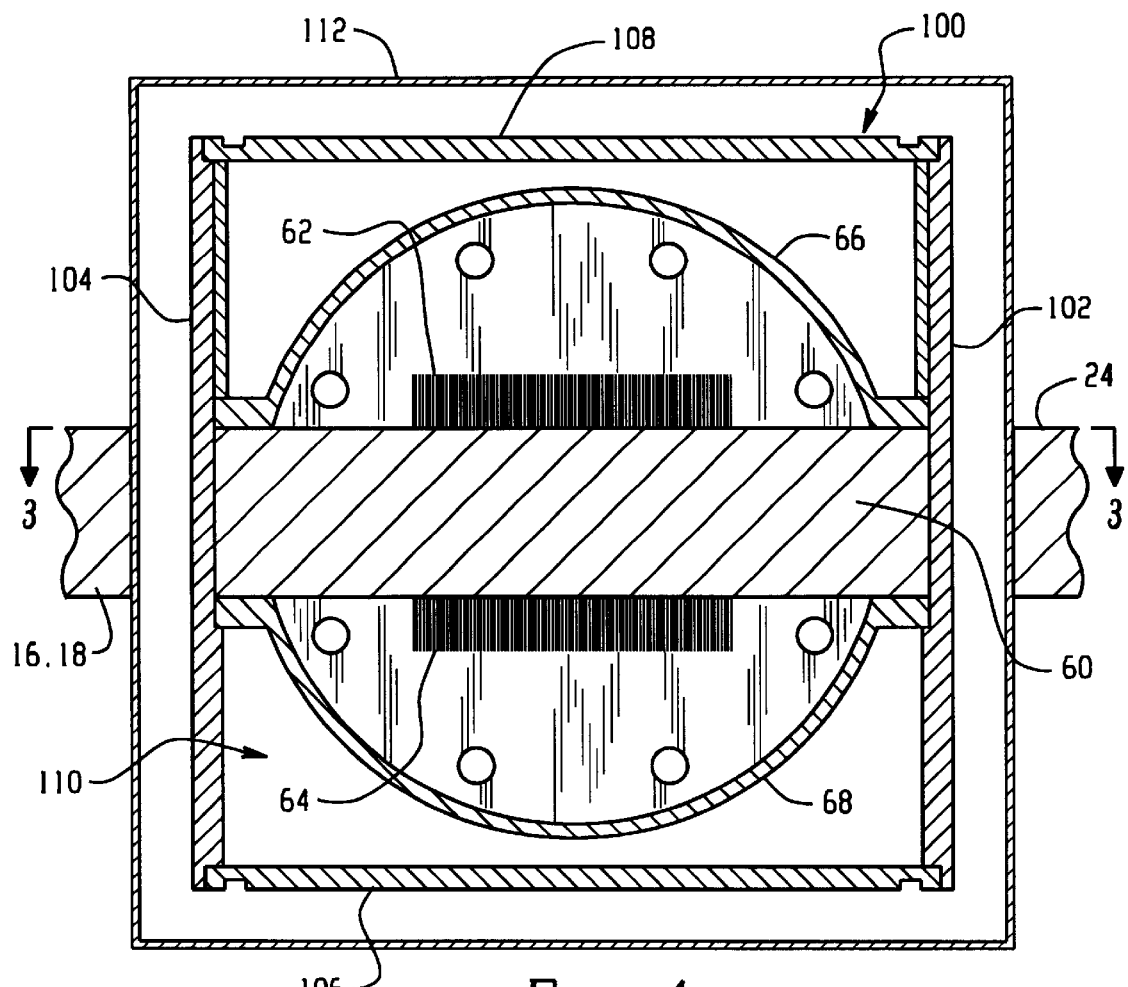
FIG. 4 is a sectional view analogous to FIG. 2 including the superconducting magnet structure and a surrounding cryostat arrangement.

With reference to FIG. 4, the assembly of FIG. 3 is encased in a surrounding helium can 100. More specifically, the helium can includes a pair of stainless steel, aluminum, or other non-ferromagnetic side walls 102, 104. The side walls are notched to define grooves of the same dimension as the dimension of the annular ferrous member 60 and flared edges of the housing elements 66, 68. In this manner, the strength of the metal in plates 102, 104 maintains the housing firmly clamped to the annular ferrous member. A bottom plate 106 is welded at its edges to the side plates 102, 104. Analogously, a top plate 108 is pressure welded to the side elements 102, 104. The welds are vacuum and pressure tight such that a helium reservoir 110 is defined between the walls 102, 104, 106, 108 and the housing elements 66, 68. Again, the housing elements 66, 68 and the packing material 70, 72 preferably have passages and apertures to permit helium flow over the superconducting material 62, 64. A vacuum vessel 112 is defined around the helium can 100. Optionally, other intermediate layers, such as a liquid nitrogen cooling layer, and the like, may be incorporated into the cryostat.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A magnet assembly comprising:
   an annular first magnet coil disposed in a first plane surrounding a first cross-sectional area;
   a first ferrous element having a face of a second cross-sectional area smaller than the first cross-sectional area, the first ferrous element face being disposed in a second plane parallel to the first plane and adjacent an examination region for concentrating a magnetic field generated by the first magnet coil through the examination region along a magnetic field axis perpendicular to the first and second planes;
   a first ferromagnetic path extending between the first ferrous element and an inner circumference of the first magnet coil, the first ferromagnetic path expanding radially with displacement from the second plane toward the first plane in a first dimension parallel to the first and second planes, and thinning with radial displacement from the magnetic field axis in a second dimension parallel to the magnetic field axis approaching the inner circumference of the first magnet coil to steer the magnetic field adjacent the first magnet coil parallel to the first plane, and concentrate the magnetic field along the magnetic field axis through the examination region.

2. The magnet assembly as set forth in claim 1 further including:
   a second ferrous element disposed on an opposite side of the examination region from the first ferrous element with a face in a third plane parallel to the second plane; and,
   the first and second ferrous elements having flared peripheral edges around their parallel faces adjacent the examination region which flared peripheral edges extend outward from the faces and toward the opposite ferrous element for improving uniformity of the magnetic field in the examination region.

3. The magnet assembly as set forth in claim 1 further including:
   a second ferrous element disposed on an opposite side of the examination region from the first ferrous element with a face in a third plane parallel to the second plane;
   a second magnet coil disposed in a fourth plane parallel to the first plane, the second magnet coil being of larger cross-section than the second ferrous element; and,
   a second ferromagnetic path extending between the second ferrous element and the second magnet coil, the second ferromagnetic path having a common cross-section with the second ferrous element parallel to the third plane adjacent the second ferrous element and having a flared lip abutting the second magnet coil.

4. A magnet assembly comprising:
   a ferrous structure for focusing and for directing a magnetic field through an examination region along a preselected direction, the ferrous structure including (i) an examination region portion adjacent the examination region, (ii) a radial flange portion displaced from the examination region along the preselected direction and extending from the preselected direction radially outward beyond a periphery of the examination region, and (iii) and an intermediate region connecting the examination region portion and the radial flange;
   a dipole magnet mounted around the radial flange and oriented to generate a magnetic field directed radially along the radial flange.

5. The magnet assembly as set forth in claim 4 wherein the dipole magnet includes:
   opposite polarity first and second annular windings, disposed parallel to each other.

6. The magnet assembly as set forth in claim 5 wherein a ratio of current turns in the first and second windings is selected to reduce stray magnetic fields.

7. A magnet assembly comprising:
   a dipole magnet including:
      a first annular winding,
      a second annular winding disposed parallel to the first annular winding and having an opposite polarity to define a first dipole coil pair, and
      a first annular ferrous disk disposed between the windings of the first dipole coil pair, the opposite polarity of the windings of the first coil pair generating a magnetic field radially across the ferrous disk;
   a first ferromagnetic path extending between an inner circumference of the annular ferrous disk and an examination region to focus and concentrate the magnetic field through the examination region.

8. The magnet assembly as set forth in claim 7 wherein:
   the first annular ferrous disk is disposed horizontally;
   the first ferromagnetic path includes:
      a body portion extending along a vertical axis adjacent the examination region to direct the magnetic field vertically through the examination region; and, a ferrous ring portion disposed in a horizontal plane in alignment with the inner circumference of the first annular ferrous disk, such that the magnetic field flows horizontally and radially through the ring portion, turns and flows vertically through the body portion and the examination region.

9. The magnet assembly as set forth in claim 7 further including:
a second dipole magnet having a second dipole coil pair of opposite polarity separated by a second annular ferrous disk, the second annular ferrous disk being disposed in a plane parallel to the first ferrous disk, the second dipole magnet having an opposite polarity from the first dipole magnet such that one of the dipole magnets generates a magnetic field flowing radially outward across its ferrous disk and the other generates a magnetic field flowing radially inward across its ferrous disk.

10. A magnet assembly comprising:
a dipole magnet including:
a ferrous disk having inner and outer peripheral edges and opposite sides, the ferrous disk including a series of projections and recesses along the inner peripheral edge,
an opposite polarity dipole winding pair mounted on the opposite sides of the ferrous disk to generate a magnetic field flowing radially across the ferrous disk between the inner and outer peripheral edges;
a ferrous structure having one end adjacent an examination region and an extending peripheral flange terminating in a flange peripheral edge adjacent the dipole magnet ferrous disk, the flange peripheral edge having projections and recesses corresponding to the projections and recesses of the inner peripheral edge of the ferrous disk.

11. The magnet assembly as set forth in claim 10 further including a ferrous field return path structure, the ferrous return path structure having a first edge adjacent the ferrous disk outer peripheral edge, the ferrous return path structure first edge and the ferrous disk outer peripheral edge having a series of corresponding projections and recesses.

12. A magnet assembly comprising:
a dipole magnet including:
an annular ferrous member,
a first polarity annular winding mounted on one side of the annular ferrous member,
a second polarity annular winding mounted to an opposite side of the ferrous member, the second polarity winding being of an opposite polarity to the first Polarity winding;
a first arched element extending from the ferrous member, over the first polarity winding and back to the ferrous member;
a second arched element extending from the ferrous member, over the second polarity winding and back to the ferrous member; and,
potting structures extending between the first and second arched elements, the ferrous member, and the first and second polarity windings for holding the first and second polarity windings in place.

13. The magnet assembly as set forth in claim 12 wherein the dipole magnet is superconducting and further including:
a helium can surrounding the first and second arched elements, the helium can including projecting and recessed portions for clamping edges of the first and second arched elements to the ferrous member.

14. The magnet assembly as set forth in claim 4 wherein the dipole magnet, ferromagnetic examination region portion, and the ferromagnetic structure radial flange portion are non-circular.

15. A magnetic resonance imaging apparatus comprising:
a magnetic assembly as set forth in claim 1;
a gradient and RF coils disposed adjacent the examination region;
an RF transmitter connected with the RF coils;
a sequence controller connected with the RF transmitter and the gradient coils for inducing and encoding magnetic resonance signals;
an RF receiver connected with the RF coils for receiving and demodulating the resonance signals;
a reconstruction processor for reconstructing the demodulated magnetic resonance signals into an image representation; and,
a display for displaying selected portions of the image representation in a human-readable format.

16. A magnet assembly comprising:
a first winding means for carrying a first electrical current in a first direction along a peripheral path on one side of a peripheral ferrous member;
a second winding means for carrying a second electrical current of an opposite polarity to the first electric current along a peripheral path on an opposite side of the ferrous member such that the first and second electrical currents generate the magnetic field in a common, radial direction through the ferrous member;
a means for channeling the magnetic field, turning the magnetic field, converging the magnetic field, and passing the converged magnetic field through an examination region.

17. The magnet apparatus as set forth in claim 16:
wherein the channeling means focuses the magnetic field along an elongated region, such that an elongated examination region is defined.

18. A magnetic resonance imaging method comprising:
generating a magnetic field peripherally in a radial direction by:
flowing a first electrical current in a first direction along a peripheral path on one side of a peripheral ferrous member;
flowing a second electrical current of an opposite polarity to the first electric current along a peripheral path on an opposite side of the ferrous member such that the first and second electrical currents generate the magnetic field in a common direction through the ferrous member;
channeling the magnetic field, turning the magnetic field, converging the magnetic field, and passing the converged magnetic field through an examination region;
inducing magnetic field gradients across the examination region;
exciting magnetic resonance within the examination region;
receiving magnetic resonance signals from the examination region;
reconstructing the received magnetic resonance signals into an image representation; and
converting at least a portion of the image representation into a human-readable display.

19. A magnet construction comprising:
first and second ferrous elements disposed on opposite sides of a gap for focusing a magnetic field across the gap;

at least one of the ferrous elements tapering peripherally outward to define a thinner, peripherally enlarged region with a peripheral edge;

an annular ferrous member extending along the peripheral edge, the member having a first axis that intersects the peripheral edge;

first and second windings extending peripherally around opposite sides of the ferrous member on opposite sides of the first axis, the first and second windings carrying current of opposite polarity such that the first and second windings both generate the magnetic fields in a common direction along the first axis of the ferrous member.

20. A magnet assembly which directs a magnetic field vertically through an examination region, the magnet assembly comprising:

an annular magnet disposed in a horizontal plane vertically displaced from the examination region, the magnet having a horizontal cross-section larger than a horizontal cross-section of the examination region;

a ferrous structure including:
 a face portion disposed adjacent the examination region,
 an annular flange portion disposed in a horizontal plane adjacent annular magnet and disposed to direct the magnetic field horizontally,
 an intermediate portion disposed along a smoothly curving path from the annular flange portion to the face portion, the intermediate portion turning the magnetic field between a horizontal direction adjacent the annular flange portion and a vertical direction adjacent the face portion.

21. The magnetic assembly as set forth in claim 20 wherein the intermediate portion has a constant cross-sectional area perpendicular to the magnetic field.

* * * * *